(12) United States Patent
Yang

(10) Patent No.: US 7,630,255 B2
(45) Date of Patent: Dec. 8, 2009

(54) METHOD FOR ERASING DATA OF NAND FLASH MEMORY DEVICE

(75) Inventor: Hea Jong Yang, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 81 days.

(21) Appl. No.: 11/770,872

(22) Filed: Jun. 29, 2007

(65) Prior Publication Data

US 2008/0158994 A1    Jul. 3, 2008

(30) Foreign Application Priority Data

Dec. 28, 2006   (KR) ...................... 10-2006-0137139

(51) Int. Cl.
*G11C 16/04* (2006.01)
(52) U.S. Cl. ............................ 365/185.29; 365/185.22; 365/185.11; 365/185.19
(58) Field of Classification Search ............ 365/185.29, 365/185.22, 185.11, 185.19
See application file for complete search history.

(56) References Cited

U.S. PATENT DOCUMENTS

| | | | |
|---|---|---|---|
| 6,519,184 B2 * | 2/2003 | Tanaka et al. | 365/185.22 |
| 6,646,921 B2 | 11/2003 | Roohparvar | |
| 6,657,900 B2 | 12/2003 | Roohparvar | |
| 6,937,521 B2 | 8/2005 | Avni et al. | |
| 7,200,049 B2 | 4/2007 | Park et al. | |
| 2002/0154545 A1 * | 10/2002 | Tanaka et al. | 365/185.22 |
| 2008/0089135 A1 * | 4/2008 | Ito | 365/185.29 |
| 2008/0101126 A1 * | 5/2008 | Hemink et al. | 365/185.19 |

FOREIGN PATENT DOCUMENTS

KP    10-2006-0061086    6/2006

* cited by examiner

*Primary Examiner*—Thong Q Le
(74) *Attorney, Agent, or Firm*—Marshall, Gerstein & Borun LLP

(57) ABSTRACT

A method for erasing data of a NAND flash memory device including memory cell blocks may include using a first erase voltage applied to memory cells of a block to be erased. A first verification may be performed to verify erased states of the memory cells using a first verify voltage different than a second verify voltage. Memory cells that have not passed the first verification process are classified as a first group and a verification is performed on memory cells that have passed the first verification using the second verify voltage. Memory cells that have passed the second verification are classified as a second group and memory cells that have not passed the second verification are classified as a third group. Then data of the memory cells of the three groups are erased using first, second and third step voltages and first, second and third erase voltages, respectively.

13 Claims, 6 Drawing Sheets

METHOD FOR ERASING DATA OF NAND FLASH MEMORY DEVICE

CROSS-REFERENCES TO RELATED APPLICATIONS

The present application claims priority to Korean application number 10-2006-0137139, filed on Dec. 28, 2006, which is incorporated by reference in its entirety.

BACKGROUND

This patent relates to a method for erasing data of a NAND flash memory device and more particularly to a method for erasing data of a multi-level cell (MLC) NAND flash memory device.

NAND flash memory devices are nonvolatile memory devices that are electrically programmable and erasable. NAND flash memory devices are widely used in portable electronics such as MP3 players, digital cameras, camcorders, notebook computers, PDAs, and cellular phones, a computer basic input/output system (BIOS), printers, USB drives, and the like.

When an erase operation is performed on a NAND flash memory device, a voltage of 0V is applied to a word line of a selected memory cell of the memory device and an erase voltage of about 20V is applied to a semiconductor substrate. Then, Flower-Nordheim (F-N) tunneling causes electrons, which have been stored in a floating gate, to be moved to the semiconductor substrate by a voltage difference between both ends of a tunnel oxide layer, thereby changing the threshold voltage of the cell.

Recently, a Multi-Level Cell (MLC) structure, which allows data of 2 or more bits to be selectively stored in a single memory cell, has been suggested to increase the storage capacity with a smaller chip size. The MLC structure can represent data of two bits, three bits, and even four or more bits with a single program cell threshold voltage distribution.

An operation for erasing data of an MLC flash memory device is performed according to an Incremental Step Pulse Erase (ISPE) scheme. In the ISPE scheme, one pulse with an erase voltage of, for example, about 20V is applied to each memory cell of a block and the threshold voltage of the memory cell is verified with a verify voltage of 0V to determine whether or not all the cells in the block are in the erased state. If all the cells are not in the erased state, an erased state verification method, in which a higher voltage is applied using a step voltage Vstep to again verify the erased state, is repeated until all the cells pass the erased state verification. The maximum number of loops of this procedure is previously determined.

In this conventional data erasure method, the same erase voltage and the same step voltage are applied for all blocks. That is, the same high erase voltage and the same step voltage are used without regard to the cell speeds of blocks. Thus, the conventional method cannot reduce the erasure time and also leaves the memory device easily influenced to program/erase cycling, thereby lowering the reliability of the memory device.

BRIEF SUMMARY OF THE INVENTION

A method for erasing data of a NAND flash memory device can reduce the erasure time without lowering the reliability of the memory device.

A method for erasing data of a NAND flash memory device including memory cell blocks, each block including a plurality of cell strings, each string including drain and source selection transistors and a plurality of memory cells, may include applying a first erase voltage to memory cells of a block to be erased; performing a first verification to verify erased states of the memory cells of the block using a first verify voltage higher than a second verify voltage; performing a second verification to classify memory cells that have not passed the first verification as a first group and to verify memory cells that have passed the first verification process using the second verify voltage; classifying memory cells that have passed the second verification as a second group and classifying memory cells that have not passed the second verification process as a third group; and erasing data of the memory cells of the first, second, and third groups using different step voltages and different erase voltages.

An erase operation may be performed on the memory cells of the first group with an erase voltage increased in steps of a step voltage of 0.5V until the erase voltage reaches 19V. Alternatively, an erase operation may be performed on the memory cells of the second group with an erase voltage increased in steps of a step voltage of 0.5V until the erase voltage reaches 18V. Alternatively, an erase operation may be performed on the memory cells of the third group with an erase voltage increased in steps of a step voltage of 0.5V until the erase voltage reaches 18.5V.

Data corresponding to each of the groups may be stored in a flag cell at the step of classifying the memory cells into the first to third groups.

When an erase procedure is repeated on the block, data of the flag cell may be read and an erase voltage and a step voltage of a group corresponding to the read data may be used.

DETAILED DESCRIPTION

A data erasure method according to the herein described embodiments identifies states of slow cells according to verification levels and uses different step voltages and different erase voltages according to the states of the cells. This data erasure method may reduce the total erasure time since it selectively applies different erase voltages and different step voltages according to the erasure speeds of cells of blocks.

Reference will now be made to FIG. 1 and FIGS. 3A to 3E. When an erase operation has started, an erase voltage Verase, which may be predetermined and for example may be 17V, is input to the memory and an initial number of loops, for example zero, is input (operation 110). It is then checked whether flag bits storing information of the erase operation is "00" (step 120). The next operation is performed if the flag bits are "00". The procedure when the flag bits are not "00" will be described later.

If the flag bits are "00", one pulse with the erase voltage, for example 17V, is applied to memory cells in a block to be erased to erase data programmed in the memory cells (operation 130). The conventional method uses an erase voltage of 20V. However, methods in accordance with embodiments of the present invention begin using a voltage at a lower level (for example, 17V) which reduces the likelihood of erasure failure. Cycling defects due to the erase voltage are mostly caused by deterioration of a tunnel oxide layer due to the amount of Flower-Nordheim (F-N) current that flows during a rising period of the first applied pulse of the erase voltage. Accordingly, methods in accordance with embodiments of the present invention may use a start erase voltage, for example at a level of 17V, which reduces the likelihood of erasure failure, thereby significantly reducing cycling defects due to a high erase voltage. Of course a lower or higher start erase voltage may be used, less than the conventional erase voltage, depending on the application.

Figure 1:
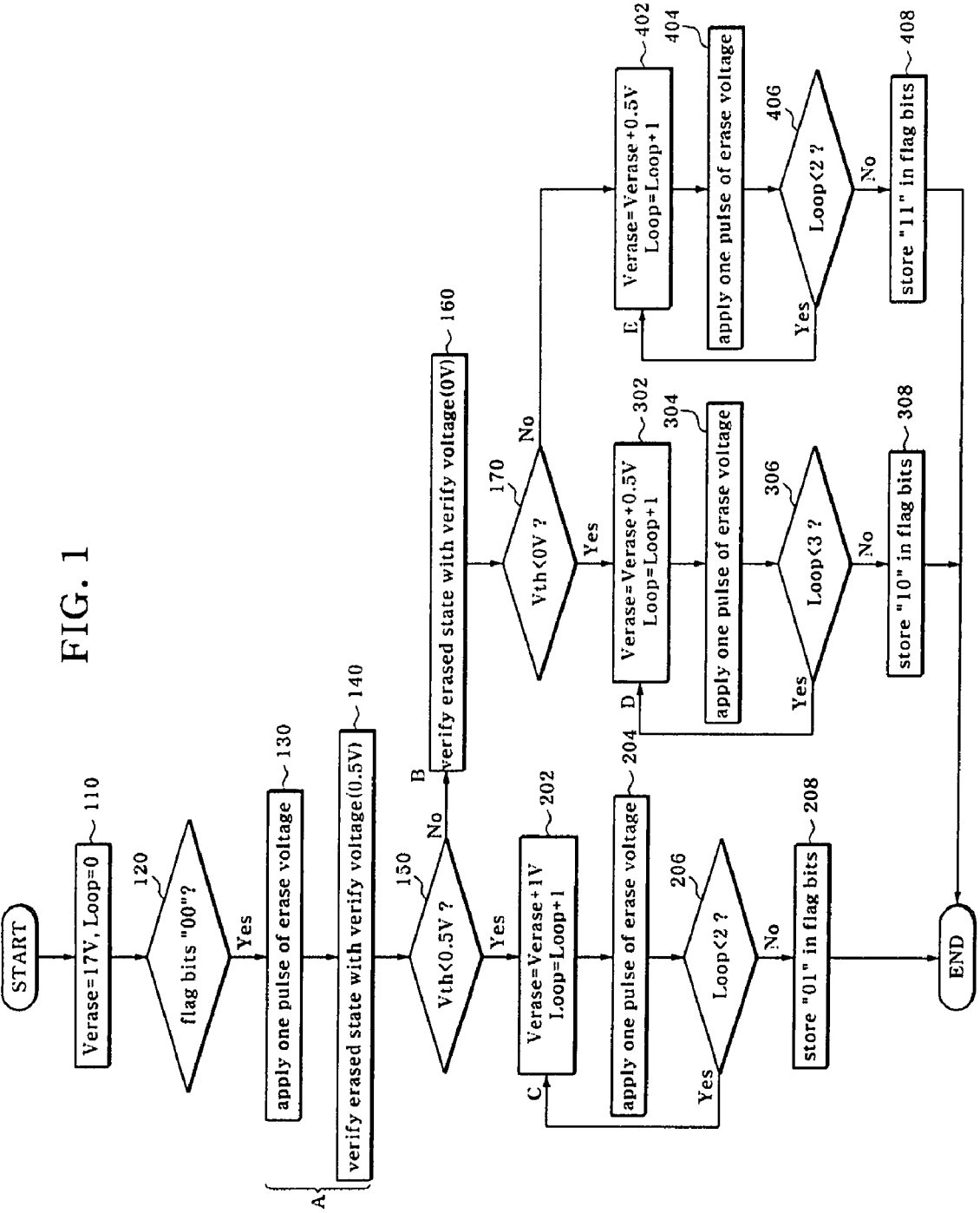
FIG. 1 and FIG. 2 are flow charts illustrating a method for erasing data of a NAND flash memory device according to herein described embodiments of the invention.
Figure 2:
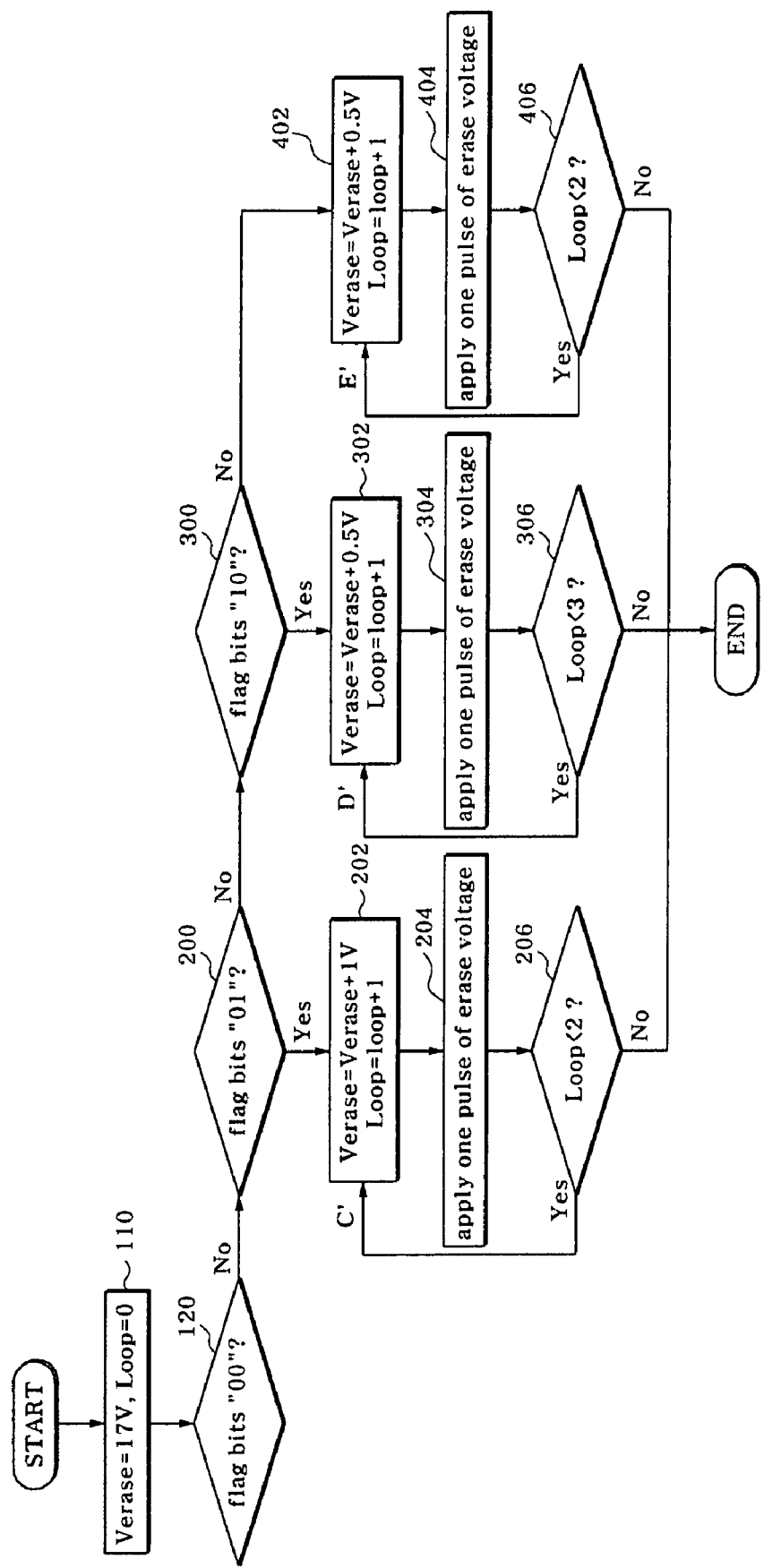
Figure 3A:
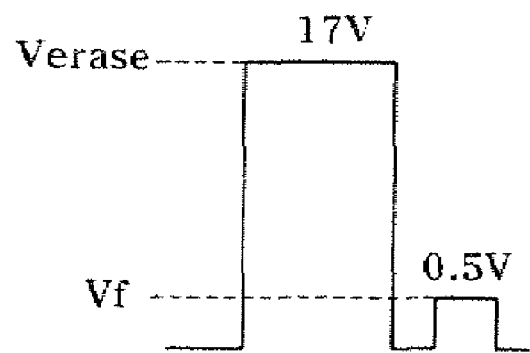
FIG. 3A to FIG. 3E and FIG. 4A to FIG. 4C illustrate word line voltage changes according to herein described embodiments of the invention.

Then, a verify voltage $V_f$, for example of 0.5V, is used to verify the erased states of the memory cells of the block to which the erase voltage has been applied (operation 140) (see FIG. 3A). That is, it is determined whether any memory cell having a threshold voltage Vth higher than the verify voltage, for example, 0.5V, is present in the memory cells of the block on which the erase voltage has been applied (operation 150). Of course a different verify voltage may be used depending on the application.

If it is determined that any memory cell having a threshold voltage Vth higher than the verify voltage, for example 0.5V, is present., i.e., that any memory cell has failed the erased state verification operation, an erase voltage increased by a step voltage Vstep is applied to repeat the erase operation. The erase operation is repeated while increasing the erase voltage in steps of the step voltage Vstep until the erase voltage reaches a threshold voltage. For example, the step voltage Vstep may increase at 1V steps until 19V threshold is attained, (operations 202 to 206) (see FIG. 3C). Of course a different voltage step including non-uniform voltage steps and a different threshold voltage may be utilized based upon particular applications. Here, "01" is stored in the flag bits (operation 208).

Figure 3B:
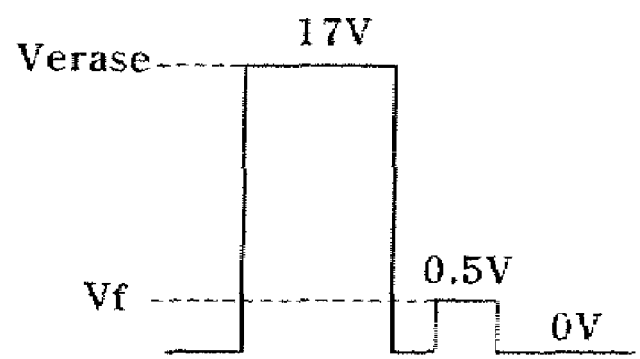
Figure 3C:
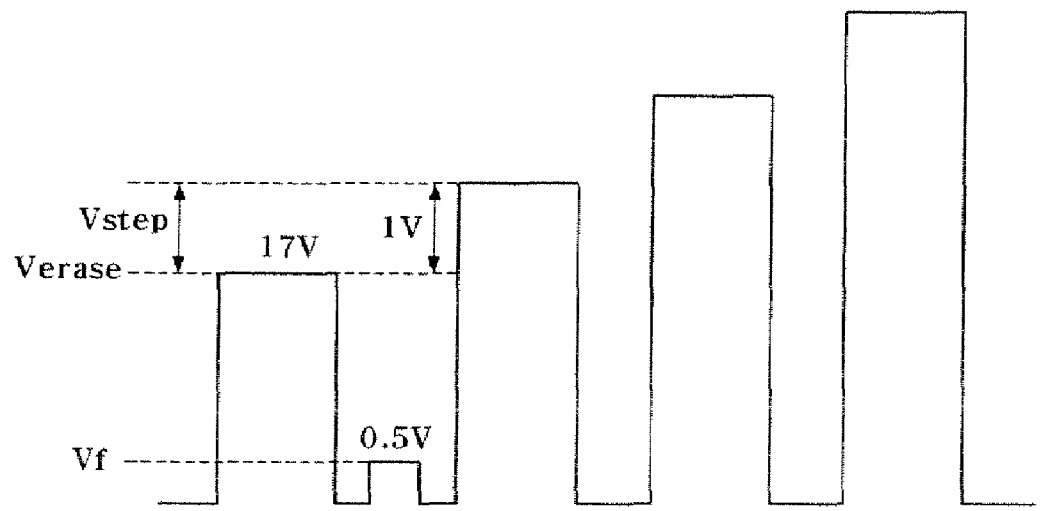
Figure 3D:
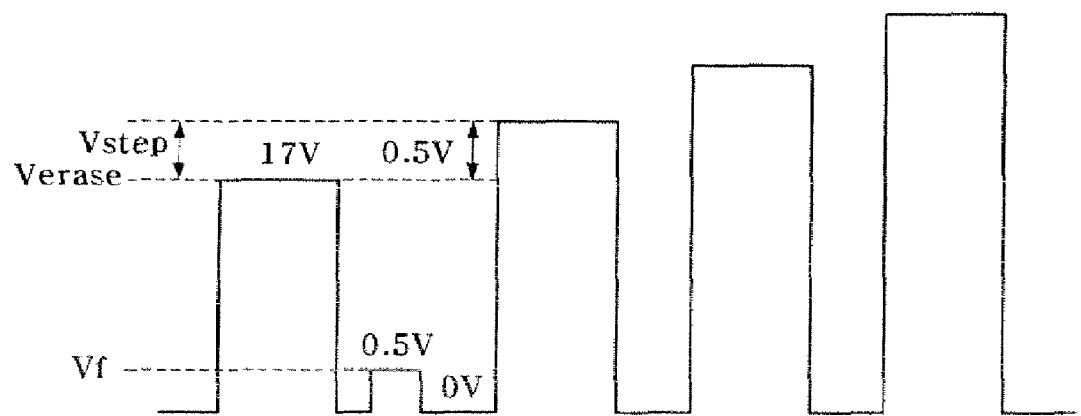
Figure 3E:
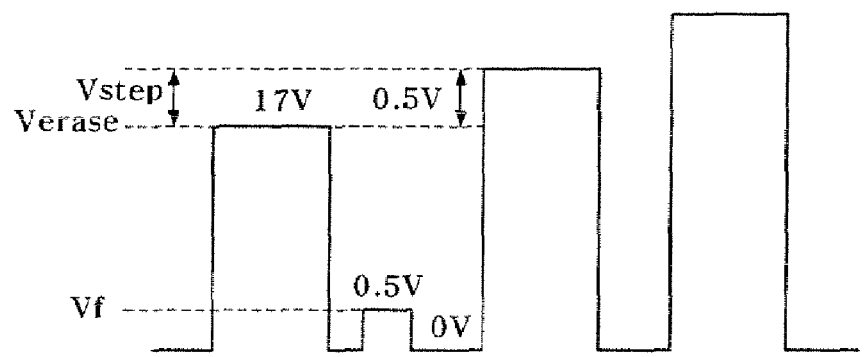
Figure 4A:
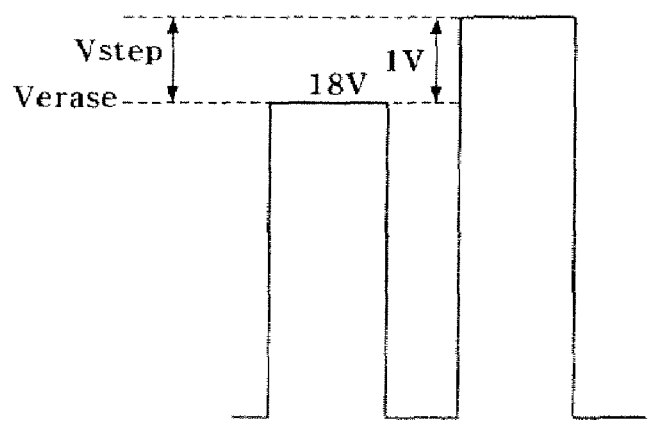
Figure 4B:
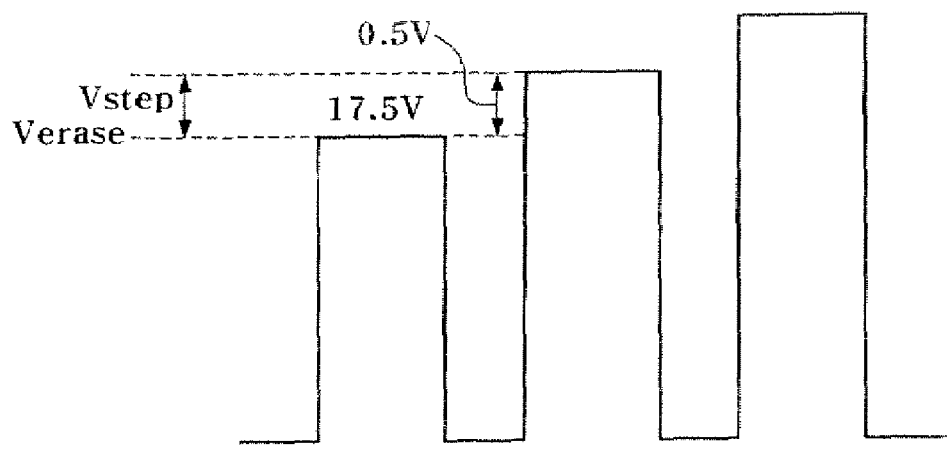
Figure 4C:
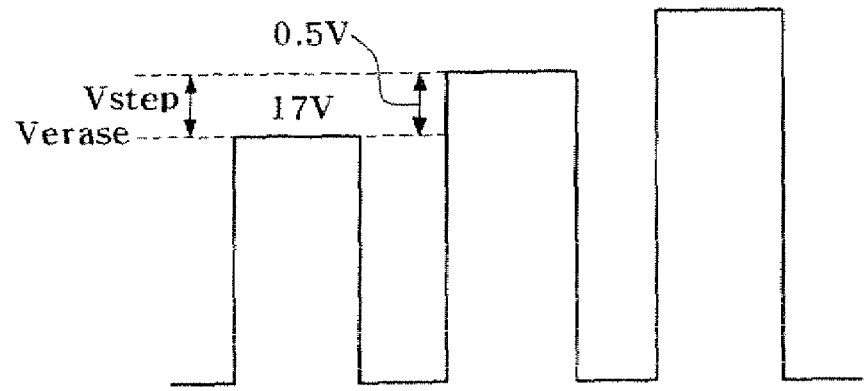

If it is determined at operation 150 that no cell has failed the verification operation, i.e., that all the cells have passed the verification operation with a first verify voltage, for example 0.5V, a verify voltage, for example a second verify voltage of 0V, may be used to again verify the erased states of the cells (operations 160 and 170) (see FIG. 3B).

If any "slow" cell, which has failed the verification with the second, reduced verify voltage, for example the verify voltage of 0V, although it has passed the verification with the first verify voltage, for example the verify voltage of 0.5V, is present, the erase operation is repeated while increasing the erase voltage in steps of the step bias to a threshold voltage. For example, the step bias may be 0.5V until the erase voltage reaches a threshold voltage of 18V (operations 302 to 306) (see FIG. 3D). Of course other step bias voltages may be used and a different threshold may be used depending on the application. Here, "10" is stored in the flag bits (operation 308).

If all the cells of the block on which the erase voltage has been applied have passed the verification operation with both the verify voltages, for example a first, high verify voltage of 0.5V and a second, low verify voltage of 0V, the erasure procedure is completed by repeating the erase operation while increasing the erase voltage in steps of the step bias up to a threshold voltage. For example, the step bias may be 0.5V until the erase voltage reaches a threshold of 18V (operations 402 to 406) (see FIG. 3E). Of course other step bias voltages may be used and a different threshold may be used depending on the application. Here, "11" is stored in the flag bits (operation 408).

The data stored in the flag bits can be used effectively when the corresponding block is erased again. Thereafter, when erasure is performed again on the same block, the data stored in the flag bits may be read to determine and apply both an erase voltage and a step voltage according to the data stored in the flag bits.

Reference will now be made to FIG. 2 and FIGS. 4A to 4C. When an erasure operation is performed again on the same block, a start erase voltage is input to the memory and an initial number of loops is input as the number of loops (operation 110) and data stored in the flag bits is read (operation 120). For example, the start erase voltage may be 17V and the initial number of loops may be zero, but these values may differ depending upon the application. If the data stored in the flag bits is "00", the erase operation is performed seguentially from operation 130 since this erase operation is the first performed on the corresponding block.

If the data stored in the flag bits is "01", the erase voltage is increased and applied in steps or a step voltage until a threshold is reached. For example, the step voltage may be a step of 1V until the erase voltage reaches a threshold of 18V (operations 200 to 206) (see FIG. 4A). Of course a different step voltage and a different threshold voltage may be used depending on the application.

If the data stored in the flag bits is "10", the erase voltage is increased and applied in steps until a threshold is reached. For example, the erase voltage may be increase in by a step voltage of 0.5V until the erase voltage reaches a threshold of 18.5V (operations 300 to 306) (see FIG. 4B). Of course a different step voltage and a different threshold voltage may be used based upon the application.

If the data stored in the flag bits is "11", the erase operation is completed by increasing and applying the erase voltage in steps of a step voltage without performing the verification operation with a verify voltage. For example, the step voltage and the verify voltage may be a voltage of 0.5V, and the verification operation is performed only when the erase voltage reaches 18V (operations 402 to 406) (see FIG. 4C). Of course other step voltages, verify voltages and erase voltages may be used based upon the application.

As is apparent from the above description, various embodiments of a method for erasing data of a NAND flash memory device according to the present invention identifies states of slow cells according to verification levels in an ISPE-based data erasure scheme and uses different step voltages and different erase voltages according to the states of the cells. Since it applies selective erase voltages and selective step voltages according to the erasure speeds of cells of blocks, the data erasure method according to the embodiments of the present invention can reduce the total erasure time and can also reduce program/erase cycling defects, thereby increasing the reliability of the memory device.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for erasing data of a NAND flash memory device including memory cell blocks, each block including a plurality of cell strings, each string including drain and source selection transistors and a plurality of memory cells, the method comprising:

applying a first erase voltage to memory cells of a block to be erased;

performing a first verification to verify erased states of the memory cells of the block using a first verify voltage higher than a second verify voltage;

grouping the memory cells that have not passed the first verification as a first group and verifying the memory cells that have passed the first verification using the second verify voltage;

grouping the memory cells that have passed the second verification as a second group and grouping the memory cells that have not passed the second verification as a third group; and erasing the first, second, and third groups of the memory cells using the first, second and third erase voltage having a first, a second, and the third step voltage, respectively, wherein the first, second and third step voltage and the first, second and third erase voltage are different from each other.

2. The method according to claim 1, wherein the first erase voltage is 17V.

3. The method according to claim 1, wherein the first verify voltage is 0.5V and the second verify voltage is 0V.

4. The method according to claim 1, wherein an erase operation is performed on the memory cells of the first group with the first erase voltage increased in steps of the first step voltage of 0.5V until the first erase voltage reaches 19V.

5. The method according to claim 1, wherein an erase operation is performed on the memory cells of the second group with the second erase voltage increased in steps of the second step voltage of 0.5V until the second erase voltage reaches 18V.

6. The method according to claim 1, wherein an erase operation is performed on the memory cells of the third group with the third erase voltage increased in steps of the third step voltage of 0.5V until the third erase voltage reaches 18.5V.

7. The method according to claim 1, wherein data corresponding to each of the groups is stored in a flag cell at the step of classifying the memory cells into the first to third groups.

8. The method according to claim 7, wherein the flag cell includes two bits.

9. The method according to claim 7, wherein, when an erase procedure is repeated on the block, data of the flag cell is read and an erase voltage and a step voltage of a group corresponding to the read data are used.

10. The method according to claim 1, wherein at the first, second and third step voltages are the same voltage.

11. The method accordingly to claim 1, wherein at least one of the first, second and third step voltages is different that one other of the first, second and third step voltages.

12. The method according to claim 1, wherein at the first, second and third erase voltages are the same voltage.

13. The method accordingly to claim 1, wherein at least one of the first, second and third erase voltages is different that one other of the first, second and third erase voltages.

* * * * *